United States Patent [19]

Suzuki

[11] 4,032,953

[45] June 28, 1977

[54] SENSING CIRCUITS

[75] Inventor: Sadao Suzuki, Tokyo, Japan

[73] Assignee: Sony Corporation, Tokyo, Japan

[22] Filed: Apr. 25, 1975

[21] Appl. No.: 571,687

[30] Foreign Application Priority Data

May 10, 1974 Japan .............................. 49-52108

[52] U.S. Cl. .................................. 357/25; 357/26; 357/27; 357/28; 357/30; 357/38; 357/43; 307/299 A

[51] Int. Cl.² .................. H01L 29/66; H01L 29/74; H01L 27/02; H03K 3/26

[58] Field of Search .................. 357/25, 26, 27, 28, 357/30, 38, 43; 307/299, 308

[56] References Cited

UNITED STATES PATENTS 3,641,404  2/1972  Per ...................................... 357/38

FOREIGN PATENTS OR APPLICATIONS 906,036  9/1962  United Kingdom ................. 357/89

Primary Examiner—Edward J. Wojciechowicz
Attorney, Agent, or Firm—Hill, Gross, Simpson, Van Santen, Steadman, Chiara & Simpson

[57] ABSTRACT

A sensing circuit is provided which includes a sensing element sensitive to given physical factors, such as temperature, light, magnetic field, and so forth. The sensing circuit includes a novel four-terminal junction type semiconductor device connected in the biased circuit of the gate region of the semiconductor device.

2 Claims, 13 Drawing Figures

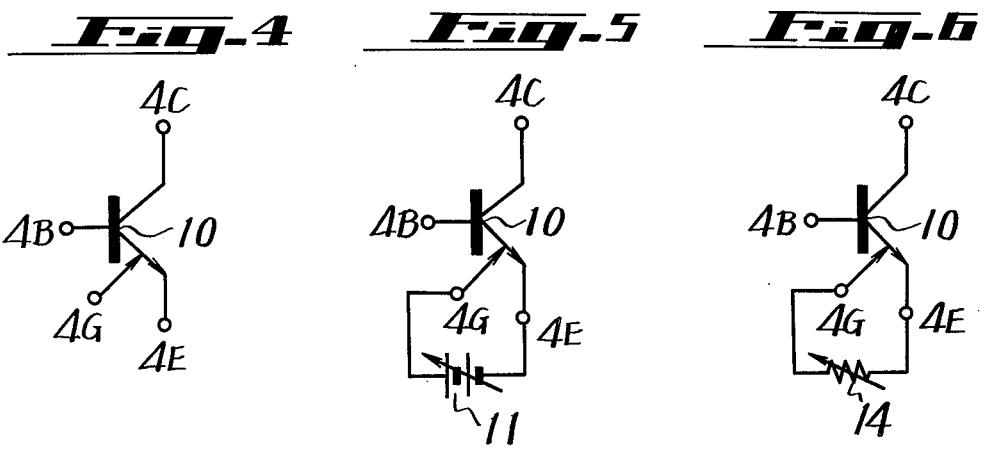
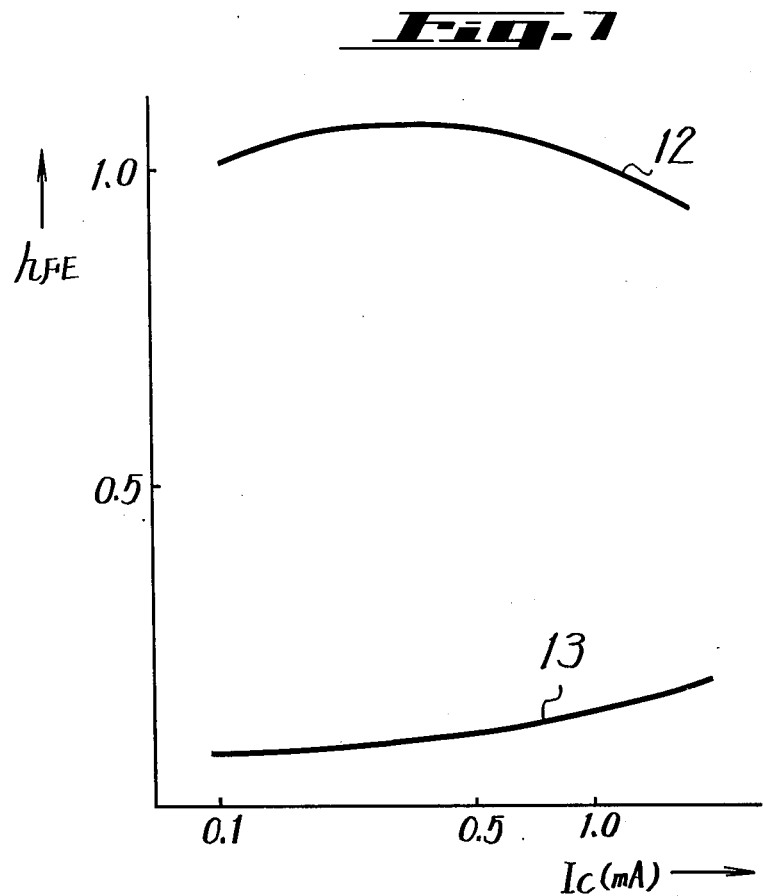

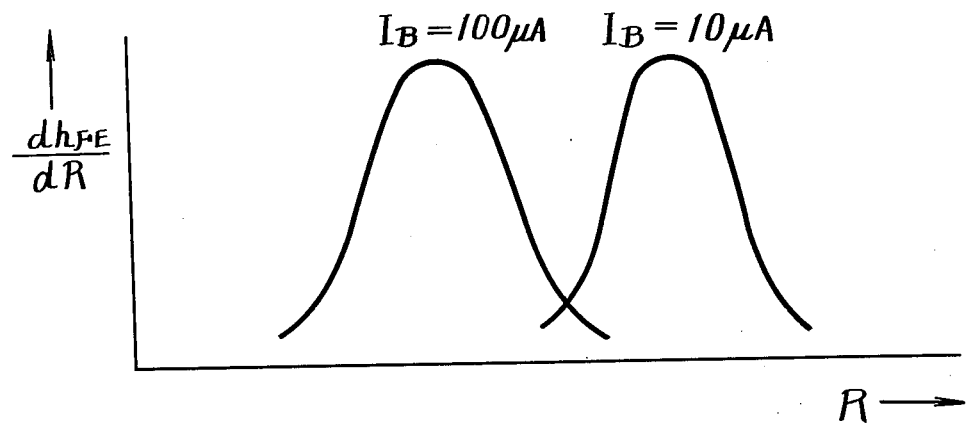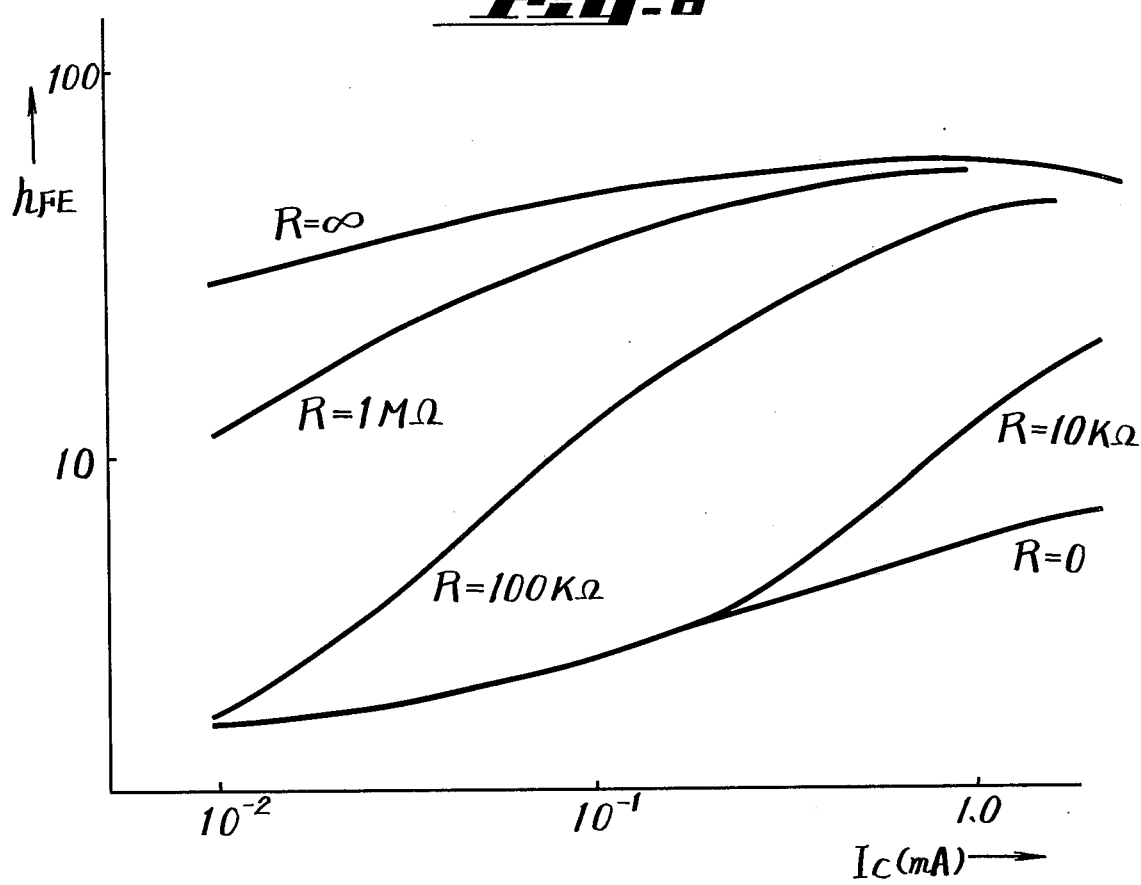

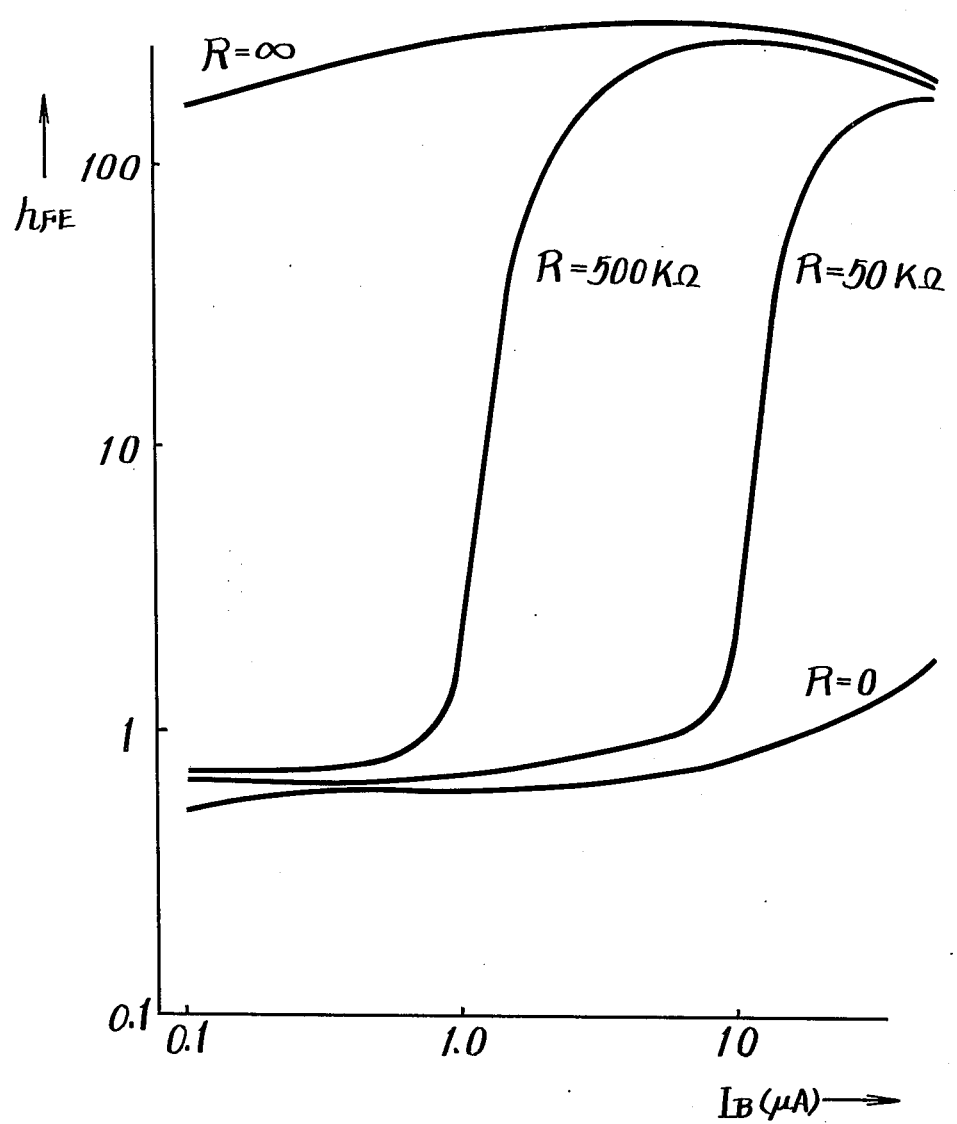

SENSING CIRCUITS

CROSS REFERENCE TO RELATED APPLICATIONS

Cross reference is here made to pending applications, Ser. Nos. 427,648 and 427,647, which are assigned to the same assignee as the present invention.

BRIEF SUMMARY OF THE INVENTION

The present invention provides a sensing circuit which includes a novel four-terminal junction type semiconductor device. The semiconductor device has an emitter region, a base region and a collector region, as well as a gate region over a part of the emitter region. The emitter region, as well as the collector region, are of relatively low impurity concentration. The base current is maintained constant after its bias has been adjustably set by an adjustable resistor. The sensing element is connected between the gate region and the emitter region.

BRIEF DESCRIPTION OF THE DRAWINGS

FIG. 4 shows the symbolic notation employed to indicate the four-terminal semiconductor device of the present invention;

FIGS. 5 and 6 are connection diagrams used for explaining the device shown in FIG. 3;

FIGS. 7 to 11 are graphs showing characteristics of the semiconductor device illustrated in FIG. 3;

DESCRIPTION OF THE PREFERRED EMBODIMENTS

Figure 1:
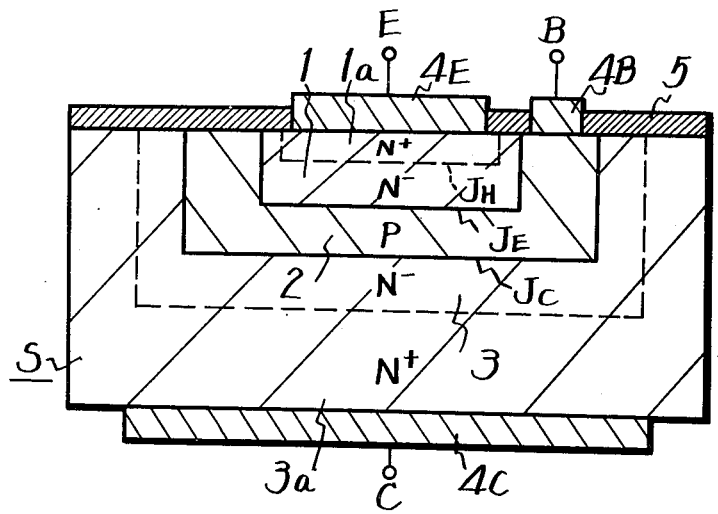
FIGS. 1 and 2 diagrammatically illustrate two forms of three-terminal semiconductor devices as will be referred to explain the novel four-terminal semiconductor device.

This invention relates to a sensing circuit employing a novel four-terminal semiconductor element in place of a prior art transistor, said semiconductor element being provided with a specific construction as compared with the prior art transistor to arbitrarily vary its emitter-grounded current amplification factor as a transistor, which can easily detect temperature, light, magnetic field and so on with simple circuit construction.

Before describing the present invention, an embodiment of the novel semiconductor device or bipolar transistor usable in the invention will be now described.

The emitter-grounded current amplification factor $h_{FE}$ of a transistor, which is one of parameters evaluating the characteristics of the bipolar transistor, can be expressed by the following equation (1), if the base-grounded current amplification factor of the transistor is taken as $\alpha$.

$$h_{FE} = \alpha/1-\alpha \qquad (1)$$

The factor $\alpha$ is expressed as follows:

$$\alpha = \alpha^* \beta \gamma \qquad (2)$$

where $\alpha^*$ represents the collector amplification factor, $\beta$ the base transfer efficiency and $\gamma$ the emitter injection efficiency, respectively.

Now, if the emitter injection efficiency $\gamma$ of an NPN-type transistor is taken into consideration, $\gamma$ is given by the following expression (3).

$$\gamma = \frac{J_n}{J_n + J_p} = \frac{1}{1 + \frac{J_p}{J_n}} \qquad (3)$$

where $J_n$ represents the current density of electrons injected from the emitter to the base of the transistor and $J_p$ the current density of holes injected from the base to the emitter of the transistor, respectively.

Since $J_n$ and $J_p$ are expressed by the following equations (4) and (5), respectively, $$J_n = \frac{qD_n n_p}{L_n} \left\{ \exp\left(\frac{qV}{kT}\right) - 1 \right\} \qquad (4)$$

$$J_p = \frac{qD_p p_n}{L_p} \left\{ \exp\left(\frac{qV}{kT}\right) - 1 \right\} \qquad (5)$$

the ratio of $\delta$ of $J_n$ and $J_p$ is expressed as follows:

$$\delta = \frac{J_p}{J_n} = \frac{L_n}{L_p} \cdot \frac{D_p}{D_n} \cdot \frac{p_n}{n_p} \qquad (6)$$

where $L_n$ represents the diffusion distance of the minority carriers in the base of the transistor; $L_p$ the diffusion distance of the minority carriers in the emitter of the transistor; $D_n$ the diffusion constant of the minority carriers in the base; $D_p$ the diffusion constant of the minority carriers in the emitter; $n_p$ the concentration of the minority carriers in the base under the equilibrium state; $p_n$ the concentration of the minority carriers in the emitter under the equilibrium state; $V$ a voltage applied to the emitter junction of the transistor; $k$ the Boltzmann's constant; $T$ temperature; and $q$ the absolute value of electron charge.

If it is assumed that the impurity concentration in the emitter of the transistor is taken as $N_D$ and that in the base of the transistor taken as $N_A$, the term $p_n/n_p$ can be replaced by the term $N_A/N_D$. Further, since $L_n$ is restricted by the base width $W$ and $L_n = W$, the ratio $\delta$ is expressed as follows:

$$\delta = \frac{W}{L_p} \cdot \frac{D_p}{D_n} \cdot \frac{N_A}{N_D} \qquad (7)$$

The diffusion constants $D_n$ and $D_p$ are functions of transfer of the carrier and temperature and in this case they are assumed constant substantially.

As may be obvious from the above respective equations, in order to increase the current amplification factor $h_{FE}$ of a transistor, it is sufficient to make the ratio $\delta$ small.

Therefore, in an ordinary transistor, the impurity concentration $N_D$ of its emitter is selected high enough so as to make the ratio $\delta$ small.

However, if the impurity concentration of the emitter is selected sufficiently high, for example, more than $10^{19}$ atoms/cm$^3$, lattice defects and dislocation occur in the crystal of the semiconductor body of the transistor to deteriorate the crystal. Further, due to the fact that the impurity concentration of the emitter itself is high, a life time $\tau_p$ of the minority carriers injected to the emitter from the base becomes short.

Since the diffusion distance $L_p$ is expressed by the following equation (8)

$$L_p = \sqrt{D_p \tau_p} \qquad (8)$$

the diffusion distance $L_p$ of the minority carriers or holes becomes short. Therefore, as may be apparent from the equation (7), $\delta$ can not be made small so much and hence the injection efficiency $\gamma$ can not be made high over a certain value. As a result, the current amplification factor $h_{FE}$ can not be made high so much in the ordinary transistor.

A novel three-terminal semiconductor device which is free from the defects mentioned just above inherent to the prior art transistor is proposed as a base of the novel four-terminal semiconductor device usable in this invention. As such a three-terminal semiconductor device, an NPN-type one and a PNP-type one could be considered as in the case of the prior art transistor, but an NPN-type semiconductor device will be now described with reference to FIGS. 1 and 2, by way of example.

As shown in FIG. 1, the NPN-type three-terminal semiconductor device consists of a first semiconductor region 1 of N⁻ type conductivity formed in a semiconductor substrate S of N⁺ type conductivity, a second semiconductor region 2 of P type conductivity formed in the semiconductor substrate S adjacent the first region 1, and a third semiconductor region 3 of N⁻ type conductivity formed in the substrate S adjacent the second region 2 to form a first PN-junction $J_E$ between the first and second regions 1 and 2 and a second PN-junction $J_c$ between the second and third regions 2 and 3, respectively.

With the semiconductor device shown in FIG. 1, at the position facing the first junction $J_E$ and apart from it by a distance smaller than the diffusion distance $L_p$ of the minority carriers or holes injected from the second region 2 to the first region 1, a potential barrier having energy higher than that of the minority carriers or holes, is formed in the first region 1. In the example of FIG. 1, the impurity concentration in the first region 1 is selected low sufficiently such as in the order of $10^{15}$ atoms/cm³ and region 1a of N⁺ type conductivity or the impurity concentration of about $10^{19}$ atoms/cm³ is formed in the first region 1 to form an LH-junction and hence to form the barrier.

The impurity concentration in the second region 2 is selected in the order of $10^{15}$ to $10^{17}$ atoms/cm³ and that in the third region 3 is selected sufficiently low such as in the order of $10^{15}$ atoms/cm³.

In the semiconductor substrate S adjacent to the third region 3 but apart from the second junction $J_c$, there is formed a region 3a of N⁺ type conductivity and with the impurity concentration of about $10^{19}$ atoms/cm³.

A first electrode 4E is formed on the high impurity concentration region 1a in the region 1 in ohmic contact therewith; a second electrode 4B is formed on the second region 2 in ohmic contact therewith; and a third electrode 4C on the high impurity concentration region 3a adjacent the third region 3 in ohmic contact therewith, respectively. From these electrodes 4E, 4B and 4C there are led out first, second and third terminals E, B and C, respectively. In FIG. 1, reference numeral 5 indicates an insulating layer made of, for example, $SiO_2$ and formed on the surface of the substrate S.

The semiconductor device shown in FIG. 1 can be used as a transistor. In such a case, the first region 1 serves as an emitter region, the second region 2 as a base region, and the third region 3 as a collector region, respectively, a forward bias is applied to the emitter junction $J_E$ and a reverse bias is applied to the collector junction $J_C$.

Thus, the holes injected from the base or the second region 2 to the emitter or first region 1 have a long life period of time due to the fact that the emitter region 1 has the low impurity concentration and good crystal property, and hence the diffusion distance $L_p$ of the holes in the emitter region 1 becomes long. As a result, as may be apparent from the equations (6) and (3), the emitter injection efficiency $\gamma$ can be made high. However, in the case that the diffusion distance $L_p$ is made long, if the injected holes into the emitter region 1 may arrive at the surface of the substrate S and may be recombined with electrons on the surface in practice, the diffusion distance $L_p$ could not be made long substantially. With the semiconductor device shown in FIG. 1, since the potential barrier is formed in the emitter region 1, which potential barrier faces the emitter junction $J_E$, at the position with a distance smaller than the diffusion distance $L_p$ of the minority carrier, the amount of the surface recombination is reduced and the diffusion distance $L_p$ can be taken long sufficiently.

Due to the fact that the potential barrier is formed as described above in the example shown in FIG. 1, there is performed such an effect that the current density or component $J_p$ of the holes injected from the base region 2 to the emitter region 1 is reduced. That is, on the LH-junction $J_H$ in the emitter region 1, there is caused a false Fermi level difference or built-in electric field which acts to suppress the diffusion of the holes or the minority carrier. Therefore, if the Fermi level is sufficiently high, the diffusion current caused by the concentration gradient of holes and the drift current caused by the built-in electric field are cancelled on the LH-junction with each other to reduce the hole current $J_p$ injected from the base 2 through the emitter region 1 of low impurity concentration. By this effect, the ratio of electron current arriving at the collector region 3 relative to current component passing through the emitter junction $J_E$ is increased and hence the emitter injection efficiency $\gamma$ is increased as apparent from the equation (3) to make the current amplification factor $h_{FE}$ high.

The above level difference (the height of the potential barrier) must be more than the energy of holes or at least the heat energy. The heat energy can be approximated as $kT$ but the above level difference is desired to be more than 0.1 eV. Within the transition region of the potential, the diffusion distance $L_p$ of the holes must be not terminated within the transition region, or it is required that the diffusion distance $L_p$ of the hole must be greater than the width of the transition region.

In the case that the LH-junction $J_H$ is formed as shown in FIG. 1, the potential barrier of 0.2 eV can be formed by suitably selecting the amount of impurity and gradient of the high impurity concentration region 1a.

Figure 2:
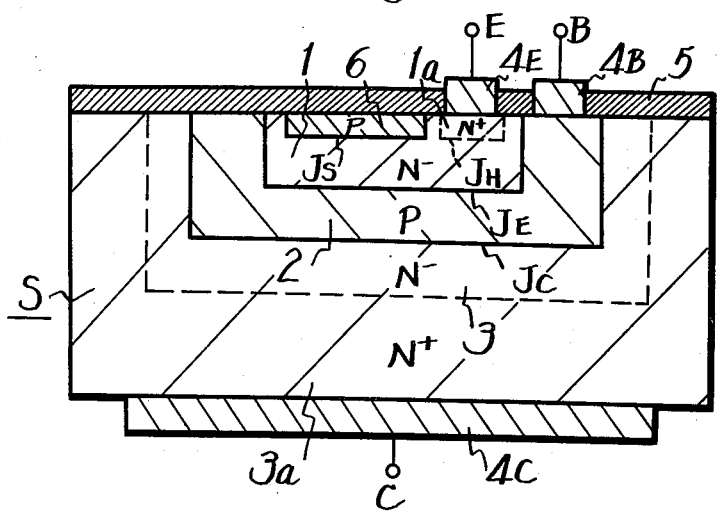

FIG. 2 shows another example of the three-terminal semiconductor device in which reference numerals and letters the same as those used in FIG. 1 indicate the same elements so that their description will be omitted.

In the example of FIG. 2, in order to form a PN-junction $J_S$ facing the first or emitter junction $J_E$, an additional region 6 of P type conductivity is formed in the first region 1. In the example of FIG. 2, the distance between the junctions $J_S$ and $J_E$ is selected smaller than the diffusion distance $L_p$ of the minority carrier in the first region 1. The other construction of the example shown in FIG. 2 is substantially the same as that of the example shown in FIG. 1.

With the example of FIG. 2, since the diffusion distance $L_p$ of the hole injected to the first region 1 is long as described above, the hole arrives at the additional region 6 effectively and then is absorbed thereby. When the additional region 6 is floated from an electrical point of view, its potential is increased as the number of holes arriving at the additional region 6 is increased. Thus, the PN junction $J_S$ formed between the regions 6 and 1 is biased forwardly to its rising-up voltage substantially, and then holes will be re-injected to the first region 1 from the additional region 6. Thus, the concentration of holes in the first region 1 near the additional region 6 will be increased, and, accordingly, the concentration distribution of holes between the junctions $J_E$ and $J_S$ in the first region 1 is made uniform and the gradient thereof becomes gradual to reduce the diffusion current $J_p$ from the second region 2 to the first region 1.

Figure 3:
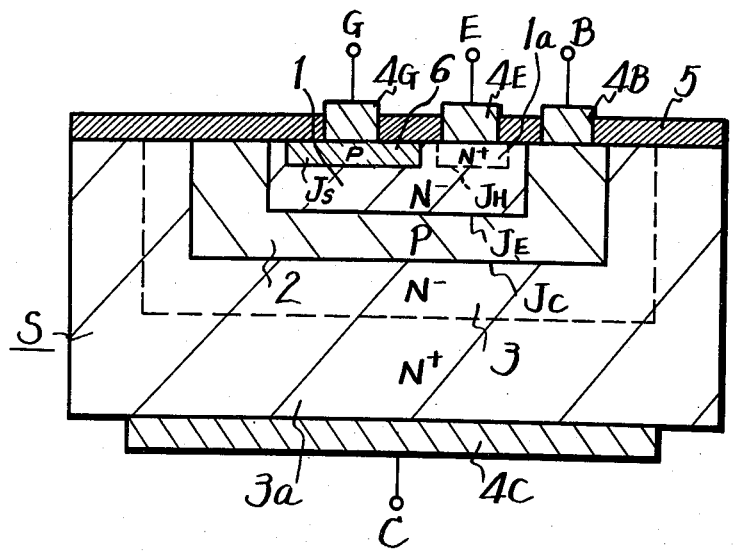
FIG. 3 is a diagrammatic view of the four-terminal semiconductor device used in the circuit of the present invention.

FIG. 3 shows a novel four-terminal semiconductor element for use in the invention in which reference numerals the same as those used in FIGS. 1 and 2 designate the same elements. In the semiconductor device of FIG. 3, the additional region 6 is used as a gate or control semiconductor region, so that an additional electrode 4G is formed on the control region 6 in ohmic contact therewith and a terminal G is led out from the electrode 4G. The semiconductor device of FIG. 3 will be hereinbelow symbolized as shown in FIG. 4, at 10.

As shown in FIG. 5, between the additional electrode 4G and first electrode or emitter electrode 4E of the semiconductor device 10, there is connected a DC voltage source 11. Now, it is considered that the voltage of the DC voltage source 11 is varied from zero to a forward voltage drop value $V_{BE}$ of the PN-junction in the semiconductor device 10. When the voltage value of the DC voltage source 11 is selected to be the forward voltage drop $V_{BE}$ of the PN-junction, the potential of the additional electrode 4G or control region 6 becomes the same as the potential of the base in the operating state so that, as in the case of FIG. 2, where the control region 6 is floated from electrical point of view, holes are re-injected from the region 6 to the emitter region 1 and the diffusion current $J_p$ from the base region 2 to the emitter region 1 becomes small with the result that the current amplification factor $h_{FE}$ becomes high. If the voltage value of the DC voltage source 11 were so selected that the potential at the additional electrode 4G would be lower than that at the base, the control region 6 would operate differently from the former case. In this latter case, the holes injected from the base region 2 to the emitter region 1 would be absorbed into the control region 6, and accordingly, the concentration of the holes near the junction $J_S$ of the emitter region 1 would become very low. As a result, the gradient of the hole concentration in the emitter region 1 would become sharp and hence the diffusion current $J_p$ from the base region 2 to the emitter region 1 would increase to make the factor $h_{FE}$ small.

FIG. 7 is a graph showing the comparison between the case in which a curve 12 represents the case where the potential at the additional electrode 4G is the same as that at the base and a curve 13 represents the case where the potential at the additional electrode 4G is the same as that at the emitter. In this graph, when the collector current $I_c$ is 0.1 mA (milli-ampere) where the potential at the additional electrode 4G is the same as the base potential, the current amplification factor $h_{FE}$ is taken as 1 (normalized value), and the relationship between the collector current $I_c$ (the abscissa) and the normalized value of the factor $h_{FE}$ (the ordinates) is known. As is apparent from this graph, the factor $h_{FE}$, when the potential at the electrode 4G is the same as the emitter potential, is lower by about one unit than the factor $h_{FE}$ when the potential at the electrode 4G is the same as the base potential.

If the potential applied to the electrode 4G is varied from the potential the same as the base potential to the same as the emitter potential, the factor $h_{FE}$ may be varied as described above.

FIG. 6 shows an example in which a variable resistance 14 is connected between the additional electrode 4G and first or emitter electrode 4E of the semiconductor device 10. In the operating state of the device 10 in this case, the electrode 4G is supplied with a potential which is a division of a constant voltage difference between the base and emitter of the device 10 by the inner resistance value of the device 10 between the base electrode 4B and the additional electrode 4G and the resistance value of the variable resistor 14. Thus, if the resistance value of the variable resistance 14 is varied from zero to infinity, the potential applied to the electrode 4G may be varied from the potential of the base to the potential of the emitter. By varying the potential applied to the electrode 4G, the factor $h_{FE}$ is varied.

FIG. 8 is a graph showing the relationship between the collector current $I_o$ (mA)(the abscissa) and the current amplification factor $h_{FE}$ (the ordinates) when the resistance value R of the variable resistance 14 is taken as a parameter. Further, in the graph of FIG. 8, the voltage $V_{CE}$ between the collector and emitter is 3V (volts).

FIG. 9 is a graph showing the relationship between the base current $I_B$ ($\mu$A)(micro-amperes) and the factor $h_{FE}$ when the resistance value R of the variable resistance 14 is taken as a parameter.

Figure 10:
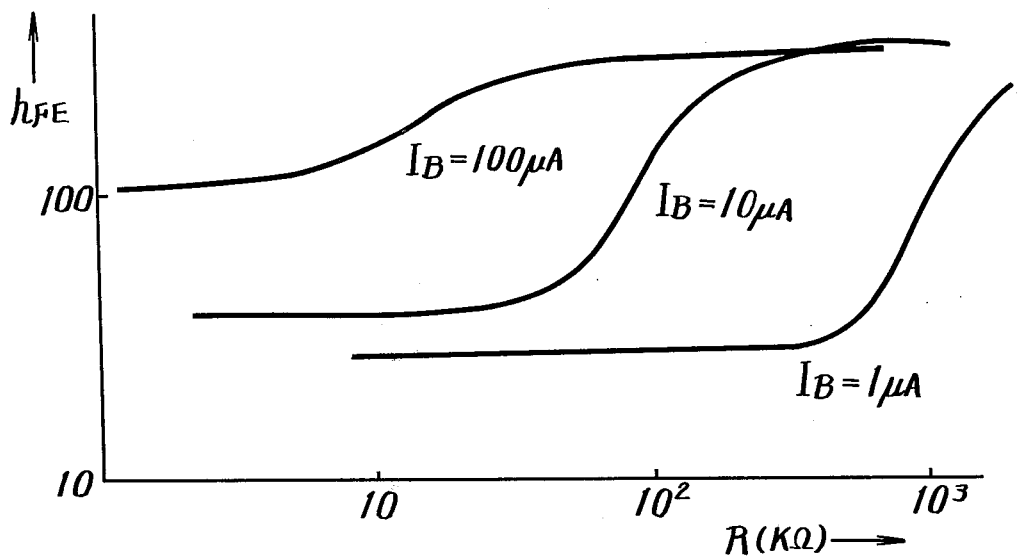

FIG. 10 is a graph showing the relationship between the resistance value R of the variable resistance 14 and the factor $h_{FE}$ when the base current $I_B$ is taken as a parameter. In cases of FIGS. 9 and 10, the voltage $V_{CE}$ is 3V, respectively.

FIG. 11 is a graph showing the relationship between the resistance value R of the resistance 14 and a value of the factor $h_{FE}$ being differentiated with the resistance value R ($d^hFE/dR$) when the base current $I_B$ is taken as a parameter. From the graph of FIG. 11, it will be apparent that the curves of FIG. 11 are symmetrical with respect to certain values of the resistance R.

The sensing circuit according to this invention utilizes the above described novel four-terminal semiconductor device to easily detect temperature, light, magnetic field and the like.

Embodiments of the sensing circuit according to the invention will be hereinafter described with reference to FIGS. 12 and 13, in which the same reference numerals indicate the same elements.

In this invention, an element whose resistance value is varied in response to temperature, light, magnetic field or the like is connected between the additional electrode 4G and the first electrode 4E of the semiconductor device 10.

Figure 12:
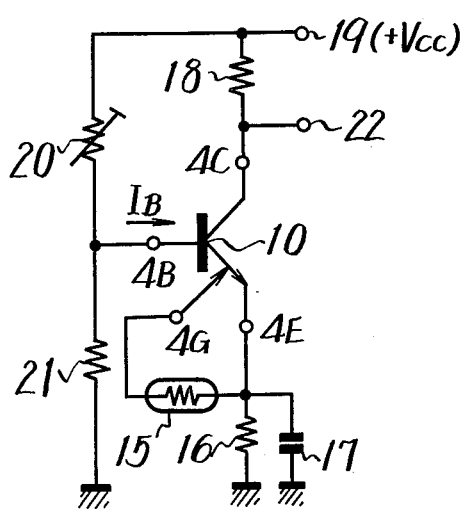
FIGS. 12 and 13 are connection diagrams showing embodiments of the sensing circuit of the present invention.

The embodiment of the invention shown in FIG. 12 is formed for detecting temperature, in which a thermistor 15 is connected between the additional electrode 4G and first electrode 4E of the semiconductor device 10. The first electrode 4E is grounded through a parallel circuit of a resistor 16 and a capacitor 17. The third electrode 4C is connected through a resistor 18 to a voltage source 19 of, for example, $+V_{cc}$. The voltage source 19 is grounded through a series connection of an adjustable resistor 20 and a fixed resistor 21. The connection point between the resistors 20 and 21 is connected to the second electrode 4B. An output terminal 22 is led out from the third electrode 4C.

In the detector circuit shown in FIG. 12, if a thermistor is used whose resistance value increases as temperature increases, the relationship between ambient temperature T and the current amplification factor $h_{FE}$ of the semiconductor device 10 becomes substantially the same as that shown in FIG. 9, where the parameter R is replaced by the temperature T or as shown in FIG. 10 where the abscissa is taken to represent the temperature T. Further, the relationship between the temperature T and $d^hFE/dT$ of this example becomes substantially the same as that shown in FIG. 11, where the resistance R is replaced with the temperature T.

If a level detecting circuit such as a Schmidt circuit, which may produce a constant output when a voltage exceeds a constant level, is connected to the output terminal 22, a so-called thermosensitive switch may be formed.

Further, when the base current $I_B$ is set as described above, as may be apparent from the graph of FIG. 11, the differentiated value of the collector current $I_C$ exceeds a predetermined value within a predetermined range of temperature T. If a differentiation circuit is connected to the output terminal 22 and a level detecting circuit such as a Schmidt circuit is connected to the output side of the differentiating circuit, the above circuit will produce a constant output only when the temperature T is within the predetermined range. Thus, such a circuit may be employed for keeping a temperature within a predetermined range.

It may be apparent that if such an element, whose resistance value decreases as its ambient temperature increases, is used as the thermistor 15 of the detecting circuit, it achieves the same effect.

Figure 13:
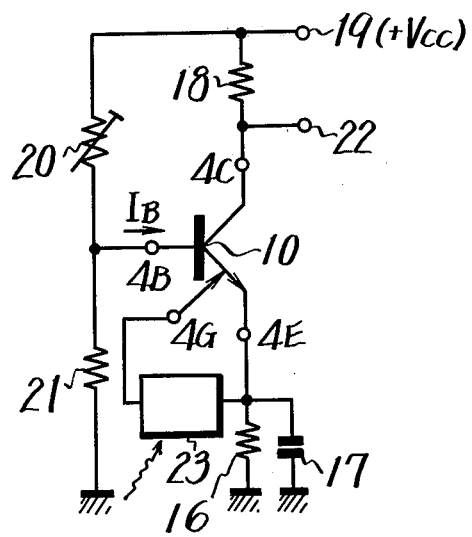

FIG. 13 shows a further embodiment of the invention which is suitable for detecting light. As shown in FIG. 13, a photo-sensitive element 23 such as a photo-diode or the like, whose resistance value is varied in response to the intensity of light incident thereon, is connected between the additional electrode 4G and the first electrode 4E of the device 10 and the setting resistor 20 is connected to the circuit at the side of the second electrode 4B.

The embodiments shown in FIG. 12 uses a thermistor 15 to detect the ambient temperature, and that of FIG. 13 uses a photo-sensitive element 23 to detect the light incident thereon, but it can easily be understood that in place of the thermistor 15 or the photo-sensitive element 23, a magneto-sensitive element such as a Hall element whose resistance value changes in response to a magnetic field applied thereto or an element whose resistance value may change in response to its ambient moisture may be used, and the magnetic field or moisture detected.

As described above, according to this invention, there is used the semiconductor element whose emitter-grounded current amplification factor $h_{FE}$ can be arbitrarily varied, so that temperature, light, magnetic field and so on can be detected easily with simple circuit construction. Further, the detection of the above phenomena may be performed in various manners and hence this invention can be widely used.

A semiconductor element whose respective regions have the opposite conductivity types as those of the regions of the element shown in FIG. 3, or PNP type semiconductor element, can be used in the invention with the same effects.

It will be apparent to those skilled in the art that many modifications and variations may be effected without departing from the spirit and scope of the novel concepts of the present invention.

I claim as my invention:

1. A sensing circuit which comprises a four-terminal semiconductor device having a first semiconductor region of one conductivity type, a second semiconductor region of the opposite conductivity type adjacent said first region with a first semiconductor junction therebetween, a third semiconductor region of the same type as said first region adjacent said second region with a second semiconductor junction therebetween, said first and third regions of the semiconductor device having an impurity concentration of substantially the same order of magnitude and a fourth semiconductor region of the same conductivity type as said second region being provided in contact with said first region at a position which is spaced from said first junction by a distance which is smaller than the diffusion distance of the minority carriers forming a potential barrier, a potential source, a bias circuit for said second semiconductor region, a sensing element connected between said fourth and first semiconductor regions, said sensing element having a resistance value dependent upon a given environment condition, a biasing circuit for said first semiconductor region, a load connected between said potential source and said third semiconductor region, and an output terminal connected to said third semiconductor region.

2. A sensing circuit according to claim 1, in which said biasing circuit of said second semiconductor region includes an adjustable resistance.

* * * * *